United States Patent
Pai et al.

[11] Patent Number: 5,378,996
[45] Date of Patent: Jan. 3, 1995

[54] RF POWER AMPLIFIER CONTROL

[75] Inventors: Klaus Pai, Hohenstein; Ralf Gregory, Darnstadt, both of Germany

[73] Assignee: Motorola, Inc., Schaumburg, Ill.

[21] Appl. No.: 154,241

[22] Filed: Nov. 18, 1993

[30] Foreign Application Priority Data

Nov. 28, 1992 [GB] United Kingdom ............... 9224975

[51] Int. Cl.⁶ ............................................. H03G 3/20
[52] U.S. Cl. ................................... 330/129; 330/141
[58] Field of Search ............... 330/85, 129, 136, 141, 330/281; 455/115, 126

[56] References Cited

U.S. PATENT DOCUMENTS

| | | | |
|---|---|---|---|
| 4,360,787 | 11/1992 | Galpin | 330/129 X |
| 5,150,075 | 9/1992 | Hietala et al. | 330/129 X |
| 5,252,929 | 10/1993 | Taroumaru | 330/129 |

FOREIGN PATENT DOCUMENTS 9100146  8/1991 European Pat. Off. .

*Primary Examiner*—Steven Mottola
*Attorney, Agent, or Firm*—Hugh Dunlop; Pedro P. Hernandez

[57] ABSTRACT

An RF power amplifier is provided having means for defining rise and fall envelopes of the RF power, i.e. the key and de-key characteristics. A power amplifier (10), detector (13) and regulator (15) form a power control feedback loop. A further regulator (21) is provided having a first input coupled to the output of the power control loop regulator and an output coupled to the input of the power control loop regulator, thereby providing negative feedback to the power control loop regulator. Means are provided, coupled to a second input of the further regulator for providing a rising and falling control signal (Vramp) for control of the power amplifier.

10 Claims, 1 Drawing Sheet

RF POWER AMPLIFIER CONTROL

FIELD OF THE INVENTION

This invention relates to an RF power amplifier having means for defining the rise and fall envelopes of the RF power i.e. the key and de-key characteristics.

BACKGROUND OF THE INVENTION

Regulatory bodies set out detailed specifications for cyclic keying of radio transmitters, for example in mobile radios, in order to minimise spurious emissions.

International patent application PCT/EP91/00146 describes an arrangement in which a power rise and fall envelope is defined in a read-only memory (ROM) in order to provide a highly controllable rise and fall power envelope. In the arrangement described in that document, there is a control loop in which the output power of the power amplifier is detected in a detector and fed in a feed back loop to one input of a comparator regulator which controls the power amplifier. The other input of the regulator is derived from a digital-to-analog converter, which derives its input from the ROM.

A problem with prior art power control loops arises from the dynamic range of the detector. Typically the amplifier has to be keyed up and down through 60 dB or more of dynamic range and typically a detector has no more than 30 dB of dynamic range capability. This means that until the power amplifier is keyed to within the dynamic range of the detector, the control loop is in effect open circuit. Moreover, the regulator typically requires a high gain in order to achieve satisfactory steady state operation. In the situation of having an effectively open loop circuit with a high gain regulator, the input to the power amplifier rises at a high rate in a virtually uncontrolled manner. This introduces a significant risk of over-swing. In effect, the input has commenced to rise too fast and too far before the output of the power amplifier enters the dynamic range of the detector and the control loop comes into operation.

In prior art arrangements such as that described in PCT/EP91/00146, a capacitor is introduced between the output and input of the regulator to provide an integration function. This is not always a fully satisfactory arrangement, because if the capacitor is too small there is over-swing and if it is too large there is a tendency to oscillate in the steady state.

There is a need for an improved power amplifier control arrangement.

SUMMARY OF THE INVENTION

According to the present invention, a power amplifier circuit for a radio transmitter is provided comprising a power amplifier having a control input and an output, a detector for monitoring the output power of the amplifier and a regulator coupled to the control input of the power amplifier, wherein the detector is coupled to a first input of the regulator, thereby providing a power control feedback loop, and wherein means are provided, coupled to a second input of the regulator for providing a rising and failing control signal for control of the power amplifier, characterised in that a further regulator is provided having a first input coupled to the output of the power control loop regulator and an output coupled to the second input of the power control loop regulator, thereby providing negative feedback to the power control loop regulator and in that the means for providing the rising and falling control signal are coupled to a second input of the further regulator.

The invention has the advantage of providing slope control which controls the power rise and tall without degrading the steady state loop performance. The problems of power overshoot or ringing during key up are avoided.

The arrangement operates down to very low power levels independently of the RF power level detectors sensitivity, because in effect it is not necessary for the power control loop to be closed during key up.

The power level detector's time constant does not influence the power slope. This is especially advantageous at low RF frequencies (low band, mid band), where high value capacitors are required to filter detector DC voltage. The second regulator can be considered to act as a limiter circuit, limiting the rise of the input to the power amplifier to a value provided by the means for providing the rising and falling control signal. This has an added benefit in that, in the event of failure in the main control loop, for example in the output power detector, a resulting open loop situation does not lead to uncontrolled increase of the power transmitted by the power amplifier.

In a further preferred feature, means are provided for inputting a level signal for defining the steady state level. This level signal can, for example, be supplied to the second input of the power control loop regulator.

It is particularly preferred that the second regulator controls the level of a signal provided to the second input of the power control loop regulator to a limit defined by the level input. This may be achieved, for example, by means of a transistor or equivalent device which gradually and under the control of the second regulator, causes the level setting signal to increase to its maximum on the second input of the first regulator.

The rising and falling signal may be provided by a microprocessor. It is preferred that a microprocessor provides a controlled rising and falling slope for the signal.

A preferred embodiment of the invention will now be described, by way of example only, with reference to the drawing.

DETAILED DESCRIPTION OF THE PREFERRED EMBODIMENT

Figure 1:
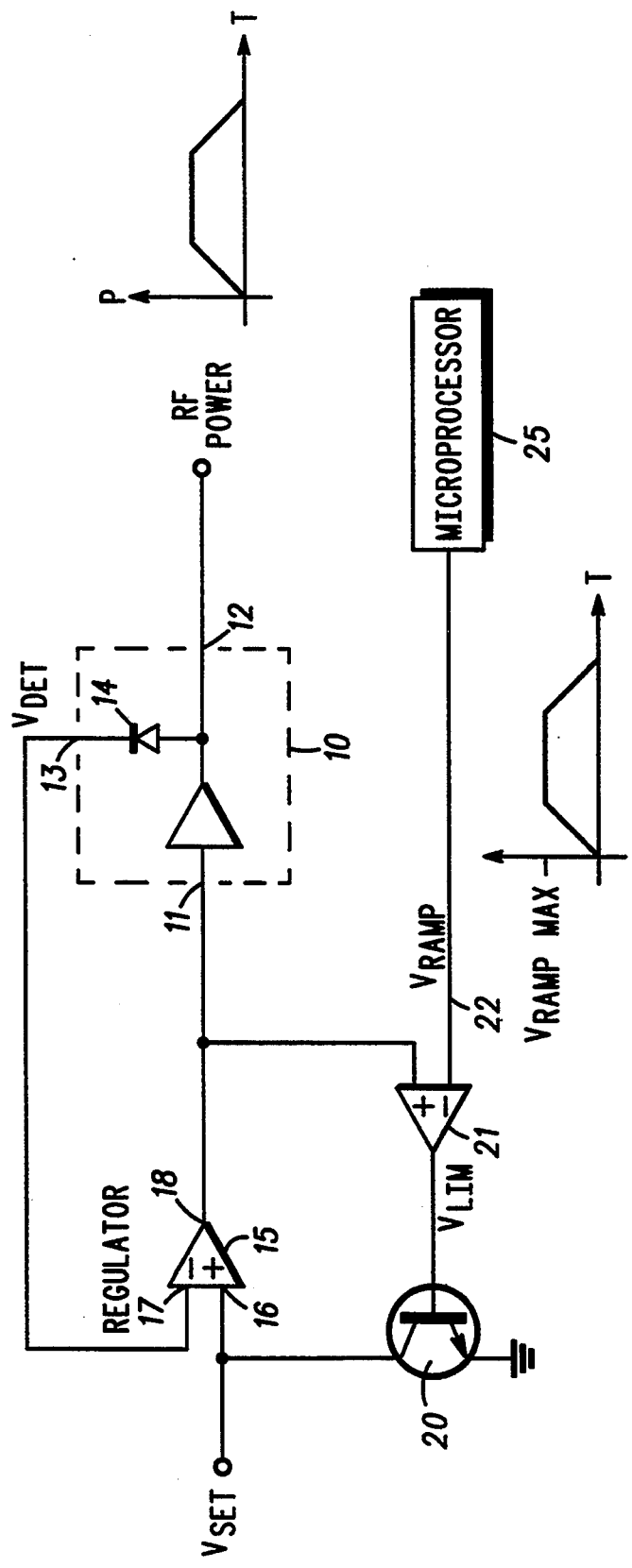
FIG. 1 shows an outline circuit diagram of a circuit in accordance with the invention.

An RF power amplifier 10 is shown, which is readily implemented by one skilled in the art. The power amplifier 10 has a control input 11, an RF power output 12 and a detector output 13. The amplifier also has an RF signal input which is not shown. The signal VDET from output 13 is provided by a simple rectifier 14.

A regulator 15 is provided having positive and negative inputs 16 and 17 and an output 18. The output 18 is connected to the control input of the power amplifier 10. The negative input 17 of the regulator receives its signal from the VDET output 13 of the power amplifier. Thus, the power amplifier, detector and regulator 15 form a main control loop with negative feedback. The regulator 15 is arranged to provide a gain factor of 1,000 to 10,000.

Connected to the positive input of regulator 15 is a signal VSET. This is provided by a simple potentiometer arrangement and is pre-set in the factory to define the radio maximum power rating, for example 10 watts or 25 watts. It will be appreciated that in particular arrangements, this may be selected by a D/A converter, for example for dynamic power control.

A NPN bipolar transistor 20 is provided having its collector connected to input 16 of regulator 15 and its emitter connected to ground. A second regulator 21 is provided having its positive input connected to the output of regulator 15 and its output connected to the base of transistor 20. Connected to the negative input of regulator 21 is a control signal input 22 which provides the signal VRAMP shown at the lower right hand side of the figure. This signal 22 is provided by a D/A converter from a microprocessor 25, but could be provided by an analog circuit.

The operation is as follows.

VSET defines the maximum steady state output power for the main control loop comprising power amplifier 10 and regulator 15. When not transmitting, VRAMP is set at zero and the output VLIM of limiter regulator 21 is high, thus holding transistor 20 open and effectively holding input 16 of regulator 15 low. In this state, the power amplifier is effectively closed.

To key up the transmitter, the signal VRAMP is linearly increased. This has the effect of controllably closing transistor 20 and allowing the input 16 of regulator 15 to rise towards VSET. As the output 18 of regulator 15 rises, this signal is fed back to limiter regulator 21 and the positive input of regulator 21 rises, thus counteracting the effect of VRAMP and providing a complete control loop for regulator 15. In this way, the rise of the output of regulator 15 is fully controlled by VRAMP. After about 30 dB of increase in output power from the power amplifier 10, the detector diode enters its operative range and an output is provided on output 13 of amplifier 10. This output is fed back to negative input 17 of regulator 15 and the main control loop enters operation and provides negative feedback for the regulator 15, while the output of regulator 15 increases to its steady state position. A steady state is reached when VRAMP reaches maximum and transistor 20 is fully closed, causing the full value of VSET to be input to the positive input of regulator 15. In a steady state condition VRAMP remains at its maximum and control is exerted by the main control loop.

In the steady state condition, if a fault occurs in the main control loop, for example the detector fails and VDET fails to zero, the output of regulator 15 is prevented from rising further, because this would have the effect of causing a fall on VLIM, thereby opening transistor 20 and causing the input on input 16 of regulator 15 to fall. The circuit is thus very robust.

As a modification to the circuit shown in FIG. 1, a capacitor can be provided between the negative input 22 of regulator 21 and the output of that regulator, thereby implementing an integrator function.

Other modifications can be devised by those skilled in the art, such as inversion of the inputs of regulator 21 and inversion of VRAMP signal, together with appropriate substitution of transistor 20.

We claim:

1. A power amplifier circuit for a radio transmitter comprising:
   a power amplifier having a control input and an output;
   a detector for monitoring the output power of the amplifier;
   a first regulator having a first input, a second input and an output coupled to the control input of the power amplifier, the first input of the regulator being coupled to the detector, thereby providing a power control feedback loop;
   means for providing a rising and falling control signal for control of the power amplifier;
   a second regulator having a first input, a second input and an output, the first input being coupled to the output of the first regulator, the second input being coupled to the means for providing the rising and falling control signal and the output being coupled to the second input of the first regulator, thereby providing negative feedback to the first regulator.

2. An amplifier according to claim 1, further comprising means for inputting a level signal for defining a steady state level for the power amplifier.

3. An amplifier according to claim 2, wherein the level signal is supplied to the second input of the first regulator.

4. An amplifier according to claim 2, wherein the second input of the first regulator is arranged to receive a signal which has a variable level and the second regulator is arranged to control said variable level to a limit defined by the level signal.

5. An amplifier according to claim 2, further comprising means under the control of the second regulator for gradually causing the level signal to increase to a maximum on the second input of the first regulator.

6. An amplifier according to claim 1 further comprising a microprocessor arranged to define the rising and failing control signal.

7. An amplifier according to claim 1, wherein the detector comprises a rectifier.

8. An amplifier according to claim 1, further comprising:
   a transistor coupled between the output of the second regulator and the second input of the first regulator.

9. An amplifier according to claim 3, wherein the means for providing a rising and falling control signal provides a linearly increasing control signal during the period the control signal is rising and a linearly decreasing control signal during the period the control signal is falling.

10. An amplifier according to claim 3, wherein the level signal defines the maximum output power provided at the output of the power amplifier.

* * * * *